United States Patent
Hofmann et al.

(10) Patent No.: US 7,265,413 B2
(45) Date of Patent: Sep. 4, 2007

(54) SEMICONDUCTOR MEMORY WITH VERTICAL MEMORY TRANSISTORS AND METHOD FOR FABRICATING IT

(75) Inventors: Franz Hofmann, München (DE); Erhard Landgraf, München (DE); Richard Johannes Luyken, München (DE); Thomas Schulz, Austin, TX (US); Michael Specht, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/073,205

(22) Filed: Mar. 5, 2005

(65) Prior Publication Data

US 2005/0199942 A1   Sep. 15, 2005

Related U.S. Application Data

(63) Continuation of application No. PCT/EP03/09295, filed on Aug. 21, 2003.

(30) Foreign Application Priority Data

Sep. 5, 2002   (DE) ................. 102 41 172

(51) Int. Cl.
*H01L 29/792* (2006.01)
(52) U.S. Cl. .............. 257/324; 257/325; 257/326; 257/329; 257/330; 257/E29.309
(58) Field of Classification Search .......... 257/315, 257/316, 324–326, 329, 330
See application file for complete search history.

(56) References Cited

U.S. PATENT DOCUMENTS 5,414,287 A    5/1995   Hong (Continued)

FOREIGN PATENT DOCUMENTS

EP   0 783 181 A1   7/1997

(Continued)

OTHER PUBLICATIONS

German Patent Office Examination Report dated May 8, 2003.

(Continued)

*Primary Examiner*—Thien F. Tran
(74) *Attorney, Agent, or Firm*—Patterson & Sheridan, L.L.P.

(57) ABSTRACT

The invention relates to a semiconductor memory having a multiplicity of memory cells and a method for forming the memory cells. The semiconductor memory generally includes a semiconductor layer arranged on a substrate surface that includes a normally positioned step between a deeper region and a higher region. The semiconductor memory further includes doped contact regions, channel regions, a trapping layer arranged on a gate oxide layer, and at least one gate electrode. The method for forming the memory cells includes patterning a semiconductor layer to form a deeper semiconductor region and a higher semiconductor region having a step positioned between the regions. The method further includes forming a first oxide layer and a trapping layer, and then removing portions of the trapping layer and the first oxide layer and applying a second oxide layer at least regions of a doped region, the trapping layer, and the step area, and applying a gate electrode to the second oxide layer and doping, at least in regions, of the deeper semiconductor region and the higher semiconductor region to form a deeper contact region and a higher contact region.

17 Claims, 2 Drawing Sheets

U.S. PATENT DOCUMENTS

| | | | |
|---|---|---|---|
| 5,508,544 A | 4/1996 | Shah | |
| 5,780,341 A | 7/1998 | Ogura | |
| 6,157,060 A | 12/2000 | Kerber | |
| 6,191,459 B1 * | 2/2001 | Hofmann et al. | 257/390 |
| 6,204,529 B1 | 3/2001 | Lung et al. | |
| 6,768,165 B1 | 7/2004 | Eitan | |
| 6,853,587 B2 | 2/2005 | Forbes | |

FOREIGN PATENT DOCUMENTS

| | | |
|---|---|---|
| EP | 0 847 091 | 6/1998 |
| EP | 1 341 239 A1 | 9/2003 |
| JP | 7235649 A | 9/1995 |
| JP | 08162547 | 6/1996 |
| WO | WO 98/06139 | 2/1998 |
| WO | WO99/07000 | 2/1999 |
| WO | WO 2004/001856 | 12/2003 |

OTHER PUBLICATIONS

International Search Report dated Dec. 29, 2003.
International Preliminary Examination Report dated Aug. 18, 2004.
Yong Kyu Lee et al., "Multi-Level Vertical Channel SONOS Nonvolatile Memory on SOI", 2002 Symposium on VLSI Technology Digest of Technical Papers, Honolulu, Jun. 11-13, 2002, Symposium on VLSI Technology, New York NY: IEEE, US, Jun. 11, 2003, pp. 208-209.
Boaz Eitan et al., "NROM: A Novel Localized Trapping, 2-Bit Nonvolatile Memory Cell," IEEE Electron Device Letters, vol. 21, No. 11, Nov. 2000, pp. 543-545.
PCT International Preliminary Examination Report dated Aug. 18, 2004.

\* cited by examiner

SEMICONDUCTOR MEMORY WITH VERTICAL MEMORY TRANSISTORS AND METHOD FOR FABRICATING IT

CROSS-REFERENCE TO RELATED APPLICATIONS

This application is a continuation of co-pending PCT patent application No. PCT/EP03/09295, filed 21 Aug. 2003, which claims the benefit of German patent application serial number DE 102 41 172.7, filed 5 Sep. 2002. Each of the aforementioned related patent applications is herein incorporated by reference in their entireties.

BACKGROUND OF THE INVENTION

1. Field of the Invention

The invention relates to a semiconductor memory having a multiplicity of memory cells and to a method for fabricating such a semiconductor memory.

2. Description of the Related Art

Nonvolatile semiconductor memory elements are known in a multiplicity of different embodiments. By way of example, programmable read-only memory (PROM), electrically programmable read-only memory (EPROM), electrically erasable programmable read-only memory (EEPROM), flash memories and also SONOS memories are used depending on the application. These memories differ in particular in terms of erasure option, programmability, programming time, retention time, storage density, and also in their fabrication costs. A low fabrication price associated with a minimum of further options has the highest priority for a multiplicity of applications. It would be desirable, in particular, to have available a particularly inexpensive memory element which is electrically programmable at least once at voltages of less than 10 V, has a retention time in the region of about 10 years, and is compatible with present-day complementary metal-oxide semiconductor (CMOS) technology with the least possible changes.

A known nonvolatile semiconductor memory which is compatible with present-day CMOS technology is described for example in the European patent application having the application number EP 02 004 568.8. In this application, each memory cell of the semiconductor memory has a planar transistor (planar MOSFET), and a trapping layer is provided in a cutout of the (control) gate section. Hot electrons that can be generated in the transistor channel as a result of suitable potential conditions at the transistor terminals can overcome the thin gate oxide layer and be trapped by the trapping layer. The presence of the electrons trapped in the trapping layer brings about a shift in the characteristic curve of the transistor, which is manifested in particular by a different threshold voltage. The difference in the threshold voltage can be utilized in a known manner for writing a "bit," since it can be determined by means of a read step.

What is disadvantageous, however, about this known memory concept is the limited possibility for scalability of the memory transistors, which makes it difficult to use this concept to fabricate high-density semiconductor memories. Consequently, a main area of application for these conventional memory transistors is in logic circuits or "system on chip" circuits (SOC circuits) with a low storage density.

A further memory transistor, which accords best of all with the requirements mentioned in the introduction, is a transistor fabricated according to the SONOS concept, such as is described by Eitan et al. in "NROM: A novel localised trapping, 2-bit nonvolatile Memory Cell", IEEE Electron Device Letters, Vol. 21, No. 11, November 2000, pages 543–545. However, this memory concept also has disadvantages with regard to its scalability, so that a high-density or highly compact arrangement of memory transistors with very small dimensions is difficult.

Therefore, there is a need for a semiconductor memory having a multiplicity of memory cells which permits a high-density cell arrangement in conjunction with simple fabrication. Furthermore, there is a need for a fabrication method for fabricating a corresponding semiconductor memory.

SUMMARY OF THE INVENTION

Embodiments of the invention provide a semiconductor memory having a multiplicity of memory cells, each of the memory cells having a semiconductor layer arranged on a substrate, the semiconductor surface of said semiconductor layer having at least one step between a deeper semiconductor region and a semiconductor region that is higher in the direction of the normal to the substrate. Each memory cell also including at least one conductively doped deeper contact region formed in the deeper semiconductor region, and a conductively doped higher contact region formed in the higher semiconductor region, and at least one channel region extending in the semiconductor layer between the deeper contact region and the higher contact region. Each memory cell further includes at least one electrically insulating trapping layer designed for trapping and emitting charge carriers, the trapping layer being arranged on a gate oxide layer adjoining the channel region, and at least one gate electrode for controlling the electrical conductivity of the channel region, the gate electrode adjoining, in regions, a control oxide layer arranged on the trapping layer and, in regions, the gate oxide layer arranged on the channel region.

Embodiments of the invention may further provide method for fabricating a semiconductor memory. The method includes providing a substrate on which a semiconductor layer is arranged, patterning the semiconductor layer to form a deeper semiconductor region, a higher semiconductor region, and a step between the higher semiconductor region and the deeper semiconductor region, and forming a first oxide layer at least on a step side area of the step and at least in regions on a surface region of the deeper semiconductor region. The method further includes applying a trapping layer to the first oxide layer, removing the trapping layer and the first oxide layer apart from a layer stack adjoining the surface region of the deeper semiconductor region and the step side area, and applying a second oxide layer at least in regions to the surface region of the deeper semiconductor region, the trapping layer, and the step side area. The method further includes applying a gate electrode to the second oxide layer, and doping, at least in regions, of the deeper semiconductor region and the higher semiconductor region to form a deeper contact region and a higher contact region.

Embodiments of the invention may further provide a method for fabricating a semiconductor memory. The method includes provision of a substrate on which a semiconductor layer is arranged, patterning of the semiconductor layer for forming a deeper semiconductor region and a semiconductor region that is higher in the direction normal to the substrate, a step being arranged between the deeper and higher semiconductor regions The method further includes formation of a first oxide layer at least on a step side area of the step and at least in regions on a surface region of the deeper semiconductor region, application of a trapping layer to the first oxide layer, and removal of the trapping layer and the first oxide layer apart from a layer stack adjoining the surface region of the deeper semiconductor region and the step side area. The method further includes application of a second oxide layer at least in regions to the surface region of the deeper semiconductor region, the trapping layer, and the step side area, application of the gate electrode to the second oxide layer, and doping, at least in regions, of the deeper semiconductor region and of the higher semiconductor region in order to form a deeper and higher contact region.

The fabrication method according to the invention is compatible to the greatest possible extent with a conventional CMOS process. Only an additional mask step is required for the mesa etching for creating the higher and deeper semiconductor regions. The first oxide layer forms the gate oxide layer between the trapping layer and the channel region. The second oxide layer forms the control oxide layer arranged between the trapping layer and the gate electrode. Furthermore, the second oxide layer forms the gate oxide layer of those channel regions in the case of which the gate electrode directly adjoins the gate oxide layer. The application of the second oxide layer thus completely encloses the trapping layer in oxide.

In one embodiment, the removal of the trapping layer and the first oxide layer is effected by means of a spacer etching step. Such spacer etching steps are known in CMOS technology. In this way, the trapping layer can be arranged in a self-aligned manner in the edge or corner regions of the mesa in a manner adjoining the deeper surface region and the step side area. A spacer etching method may also used for the arrangement of the gate electrode.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figure 1A:
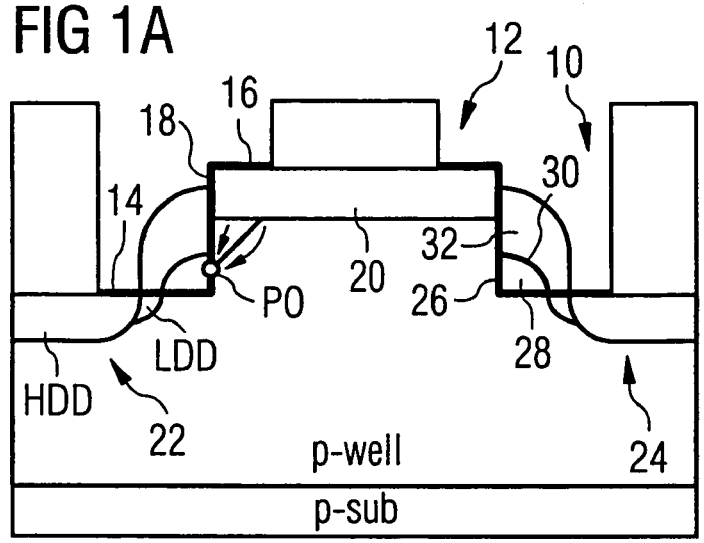
FIG. 1(a) shows a schematic sectional view through a memory cell of a first embodiment of a semiconductor memory according to the invention, the sectional plane running perpendicular to the substrate plane.

The semiconductor memory according to one embodiment of the invention uses a so-called vertical transistor concept for the memory transistors. In this case, one of the contact regions, i.e., of the memory transistor contacts is arranged in a deeper semiconductor region and the second contact region (the second memory transistor contact) is arranged in a higher semiconductor region. By way of example, one contact region of the memory transistor is situated in a deeper semiconductor region that has been removed with respect to a higher contact region by means of a mesa etching step.

The higher contact region is arranged in the higher semiconductor region, a step being provided between the two semiconductor regions. The distance between the deeper surface region of the deeper semiconductor region with respect to a substrate plane is thus less than the corresponding distance of a higher surface region of the higher semiconductor region. In other words, in the direction of the normal to the semiconductor substrate, the surface region of the higher semiconductor region is further away from the substrate than the surface region of the deeper semiconductor region. The consequence of this is that the transistor channel extending between the deeper and higher contact regions does not merely run parallel to the substrate plane, but rather has a vertical component.

A thin gate oxide layer is arranged along the surface of the channel region in a customary manner. A part of the gate oxide layer is adjoined by a trapping layer designed for trapping and emitting charge carriers. The trapping layer has a large number of defects or "trap states" in which trapped charge carriers (electrons or holes) can be permanently stored. The trapping layer is surrounded by a control oxide layer on its surfaces that do not adjoin the gate oxide layer, so that it is completely enveloped by oxide layers. The trapping layer generally includes a nitride layer, in particular a silicon nitride layer, so that an oxide-nitride-oxide layer sequence (so-called ONO stack) results in section through the memory transistor.

A (control) gate electrode is arranged on the control oxide layer and can be used, in a known manner, to control the electrical conductivity of the transistor channel by means of the field effect. The semiconductor memory according to the invention is distinguished in particular by the fact that the gate electrode, in regions, also adjoins the gate oxide layer arranged on the channel region, so that the conductivity of a section of the transistor channel can be controlled directly by the gate electrode.

A potential difference applied between the deeper and higher contact regions of the memory transistor brings about a field line profile between the contact regions in which electric field lines run from the transistor channel through the gate oxide layer into the trapping layer. In contrast to planar memory transistors as disclosed, for example, in EP 02 004 568.8 mentioned in the introduction, the process of injecting channel hot electrons (CHE) is already supported by the orientation of the electric field established between the contact regions. This enables, even at low programming voltages, efficient injection of electrons from the memory transistor channel into the trapping layer, whereby either the required programming voltage or the programming time or the required programming power ($P = U \cdot I \cdot \Delta t$) can be reduced. Furthermore, the step (mesa edge) provided between the deeper and higher contact regions contributes to an increased programming efficiency on account of an increased injection yield of hot electrons. The trapping layer is generally arranged only at a comparatively small region of the gate oxide layer. The gate electrode directly adjoins the remaining regions of the gate oxide layer.

The semiconductor memory according to the invention enables a high packing density since the memory cell area can be scaled independently of the channel length of the transistor on account of the vertical transistor concept. In contrast to planar memory concepts (for example, NROMs), the memory transistor according to the invention can be scaled significantly more simply and exhibits smaller short channel effects. The programming efficiency by means of "channel hot electrons" is furthermore increased compared with planar components on account of the particular geometry of the channel region.

The surface regions of the deeper and of the higher semiconductor region run essentially parallel to the substrate plane. The substrate is generally a monocrystalline silicon substrate and the semiconductor layer is generally a monocrystalline silicon layer.

The surface region of the higher semiconductor region forms a surface of the higher contact region. The higher semiconductor region, i.e., the mesa, thus has a conductive doping along its entire surface region running parallel to the substrate plane, so that the layer adjoining the higher surface region forms the higher contact region.

Each of the memory cells include a multiplicity of the deeper contact regions and one of the higher contact regions, one of the channel regions extending between each of the deeper contact regions and the higher contact region. In this case, the higher semiconductor region is surrounded on all sides by deeper semiconductor regions. A single higher contact region is formed on the higher semiconductor region, while a multiplicity of deeper contact regions are provided in the deeper semiconductor region. A transistor channel assigned a trapping layer and a (control) gate electrode with the construction according to the invention extends between each of the deeper contact regions and the higher contact region. A "bit" can be stored in each of the trapping layers. The deeper contact regions can generally be individually contact-connected. The gate electrodes may likewise be configured such that they can be individually contact-connected for each of the channel regions. However, a common gate electrode is provided for all of the channel regions assigned to the higher contact region.

The higher semiconductor region has, in a section running parallel to the substrate plane an essentially rectangular configuration with four side edges and each of the side edges is assigned precisely one of the deeper contact regions. In a plan view of the higher semiconductor region along the direction of the normal to the substrate, the higher semiconductor region generally has an essentially rectangular configuration that is elevated with respect to the surrounding deeper semiconductor regions. A deeper contact region is provided in a manner adjoining each of the side edges of this rectangular configuration, so that four transistor channels proceed from the higher contact region. Such an arrangement is particularly suitable for a high-density memory cell array.

The surface regions of the deeper and of the higher semiconductor region are connected by a step side area of the step, (the mesa edge) which runs essentially perpendicular to the substrate plane. The higher semiconductor region is thus separated from the deeper semiconductor region by a perpendicular mesa edge or side wall.

The trapping layer is spaced apart from the step side area and the surface region of the deeper semiconductor region by the gate oxide layer. The trapping layer is thus generally arranged in the corner or edge region of the mesa. The trapping layer adjoins both the gate oxide layer arranged on the step side area and the gate oxide layer arranged on the surface region of the deeper semiconductor region. Such a trapping layer can be fabricated in a simple self-aligning manner (without a photostep) by means of a so-called spacer etching. The trapping layer is arranged on the step side area in a manner similar to a spacer known from CMOS technology.

In accordance with a further embodiment, the surface regions of the deeper and of the higher semiconductor region are connected to one another by a deeper step side area, a higher step side area and an intermediate area extending between the step side areas. A double step or a double mesa is provided in the case of this embodiment. The step side areas generally run essentially perpendicular to the substrate plane. The two step side areas adjoin the deeper and the higher surface region, respectively, and are connected by an intermediate area that generally runs parallel to the substrate plane.

Each of the channel regions is assigned a deeper and a higher one of the trapping layers, the deeper trapping layer being spaced apart from the deeper step side area and the surface region of the deeper semiconductor region by the gate oxide layer and the higher trapping layer being spaced apart from the higher step side area and the intermediate area by the gate oxide layer. Two "bits" can be stored with such a memory transistor if the programming and reading technique known from NROMs is used. In this case, in a known manner, for reading it is necessary to interchange the contact regions compared with the programming operation. In this connection, reference is made to the publication by EITAN et al. cited in the introduction and also to the international patent application WO 99/07000 (PCT/IL98/00363). With regard to the reading and programming method, reference is made to said publication and also to the cited international patent application in their entirety, so that in this respect the publications cited are integral component parts of the overall disclosure of the present application.

In one embodiment of the invention, each of the channel regions is assigned two different trapping layers that are spatially separated from one another. The deeper trapping layer is arranged in the edge or corner region in a manner adjoining the deeper surface region and the deeper step side area. The deeper trapping layer is spaced apart from the channel region by the gate oxide layer. The higher trapping layer is generally arranged in the edge or corner region in a manner adjoining the intermediate area and the higher step side wall, and it in turn is spaced apart from the channel region by the gate oxide layer. The gate electrode generally extends over the two trapping layers, from which it is isolated by the control oxide layer. Between the deeper trapping layer and the higher trapping layer, the gate electrode adjoins the gate oxide layer in regions, so that the electrical conductivity of the transistor channel can be controlled directly in this region.

The deeper contact region generally extends as far as a step side area of the step, i.e., as far as a side wall of the mesa. Simulations have shown that a particularly efficient mechanism for injection of channel hot electrons into the trapping layer can be achieved if the deeper contact region extends as far as the edge or corner region of the mesa, i.e., as far as the step side area. In the same way, it is furthermore advantageous to form the higher contact region in such a way that it extends as far as the deeper surface region (or an intermediate area that is possibly provided). In this case, it is necessary to provide a distance between the deeper contact region and the step side area.

The trapping layer generally includes silicon nitride. In this case, the trapping layer with the silicon dioxide layers surrounding it forms a so-called ONO stack. However, it is also equally possible to use other dielectrics having high dielectric constants ("high-k dielectrics"). Furthermore, so-called "silicon rich oxide" and also undoped polysilicon are suitable for forming the trapping layer.

The fabrication method according to embodiments of the invention is compatible to the greatest possible extent with a conventional CMOS process. Only an additional mask step is required for the mesa etching for creating the higher and deeper semiconductor regions. The first oxide layer forms the gate oxide layer between the trapping layer and the channel region. The second oxide layer forms the control oxide layer arranged between the trapping layer and the gate electrode. Furthermore, the second oxide layer forms the gate oxide layer of those channel regions in the case of which the gate electrode directly adjoins the gate oxide layer. The application of the second oxide layer thus completely encloses the trapping layer in oxide.

The removal of the trapping layer and the first oxide layer is effected by means of a spacer etching step. Such spacer etching steps are known in CMOS technology. In this way, the trapping layer can be arranged in a self-aligned manner in the edge or corner regions of the mesa in a manner adjoining the deeper surface region and the step side area. A spacer etching method may also used for the arrangement of the gate electrode.

FIG. 1(a) illustrates a first embodiment of a semiconductor memory in a schematic sectional view. The sectional plane of FIG. 1(a) runs through the memory transistor perpendicular to the substrate plane of the semiconductor substrate p-sub. Arranged on the semiconductor substrate p-sub, which is p-doped for example, is a monocrystalline semiconductor layer p-well, which is lightly p-doped for example. The semiconductor layer p-well is patterned into a deeper semiconductor region 10 and a higher semiconductor region 12, for example by means of a mesa etching step. The deeper semiconductor region 10 has a deeper surface region 14 running essentially parallel to the substrate plane of the substrate p-sub. The higher semiconductor region 12 has a higher surface region 16 likewise arranged essentially parallel to the substrate plane. In the case of the embodiment shown in FIG. 1(a), the higher surface region 16 of the higher semiconductor region 12 is connected to the deeper surface regions 14 by means of step side areas 18.

A higher contact region 20 is formed in a manner adjoining the higher surface region 16 of the higher semiconductor region 12. The highly doped higher contact region 20 constitutes the source contact of the memory transistor, for example. The section shown in FIG. 1(a) furthermore illustrates two deeper contact regions 22, 24 formed in the deeper semiconductor region 10. The deeper contact regions 22, 24 constitute the drain contacts of the memory transistors, for example. In the embodiment shown in FIG. 1(a), the deeper contact regions 22, 24 have a highly doped region HDD (highly doped drain) and a more lightly doped contact region LDD (lightly doped drain) arranged nearer to the higher contact region 12.

The channel regions of the two memory transistors illustrated in FIG. 1(a) extend between the respective deeper contact regions 22, 24 and the higher contact region 20 at the interface of gate oxide layers 26 in the semiconductor layer p-well. The channel region has, at least in regions, a channel direction running perpendicular to the substrate plane, so that the memory transistors are vertical components. The deeper contact regions 22, 24 and also the higher contact region 20 are electrically contacted or connected by means of metal contacts indicated schematically. In the corner or edge region of the mesa, i.e., in the edge formed between the lower surface region 14 and the step side area 18, a trapping layer 28 is arranged in each of the memory transistors. The trapping layer 28 may includes silicon nitride, for example, which is spaced apart from the channel region by a silicon dioxide layer (a gate oxide layer 26). The trapping layer 28 may be formed in a self-aligning process (so-called spacer etching) without an additional lithography step.

A control oxide layer 30 is applied to that surface of the trapping layer 28 which does not adjoin the gate oxide layer 26, the trapping layer 28 being isolated from the gate electrode 32 by said control oxide layer. The control oxide layer 30, the trapping layer, 28 and the gate oxide layer 26 form a so-called ONO stack. A passivation layer, not specifically illustrated in FIG. 1(a), protects the contact regions and also the gate electrode and electrically insulates these from one another.

A gate electrode 32 may be formed from highly doped polysilicon. The gate electrode 32 adjoins a region of the gate oxide layer 26, so that the electrical conductivity of the assigned channel region can be controlled directly. The channel length whose conductivity can be controlled directly by the gate electrode 32 is generally between about 20 nm and about 50 nm. The width of the higher semiconductor region 12 is generally between about 50 nm and about 200 nm, the height difference in the direction of the normal to the substrate between the higher surface region 16 and the deeper surface region 14 is generally between about 50 nm and about 150 nm. However, significantly larger channel lengths or dimensions of up to several µm are also possible.

The functioning of the memory transistor of the memory cell shown in FIG. 1(a) is illustrated for the transistor formed between the contact regions 22 and 20. By means of a forward voltage having a value of less than 10 V, for example the deeper contact region 22 is positively biased with respect to the higher contact region 20. Furthermore, the gate electrode 32 is positively biased with respect to the higher contact region 20. The memory transistor is driven into its saturation region given suitable potential conditions at the transistor contacts. In the case of such source-drain voltages that are greater than the so-called pinch-off voltage, there is a so-called pinch-off point PO along the transistor channel. The voltage between the deeper contact region 22 and the higher contact region 20 is generally set in such a way that the pinch-off point PO is situated near the higher contact region 20 at a location in the transistor channel which is opposite the trapping layer 28. In the case of such potential conditions at the transistor contacts, so-called hot electrons (channel hot electrons (CHE)) are generated in particular near the pinch-off point PO. These electrons generally have a sufficient energy to overcome the thin gate oxide layer 26 and to be incorporated into the trapping layer 28. As a result of electrons being incorporated into the trapping layer 28, the characteristic curve of the memory transistor is shifted. In particular, the threshold voltage is altered, which can be used in a known manner for programming a "bit".

By virtue of the contact and channel geometry of the memory transistor shown in FIG. 1(a), the electric field lines run between the higher contact region 20 and the deeper contact region 22 in part transversely through the gate oxide layer 26. Consequently, there is an electric field component that supports the injection of channel hot electrons into the trapping layer 28. Consequently, at source-drain voltages above the pinch-off voltage, charge carriers are efficiently generated by ionization in the channel region between the deeper contact region 22 and the pinch-off point PO. These charge carriers are in turn injected into the trapping layer 28 by means of a suitable gate voltage. All voltages required for this purpose are generally in the range below 10 V. The read-out is generally effected in the inverse direction.

In the case of this vertical concept, the programming efficiency is increased since the yield of hot electrons incorporated in the trapping layer 28 is greater ($>10^{-5}$ of the channel electrons). This is caused in particular by a field compression as a result of the mesa edge and also the required 90° change in direction of the electrons in the edge region. This enables the programming time and/or the programming voltage or power to be significantly reduced, which is desirable in particular for semiconductor memories in mobile use.

Figure 1B:
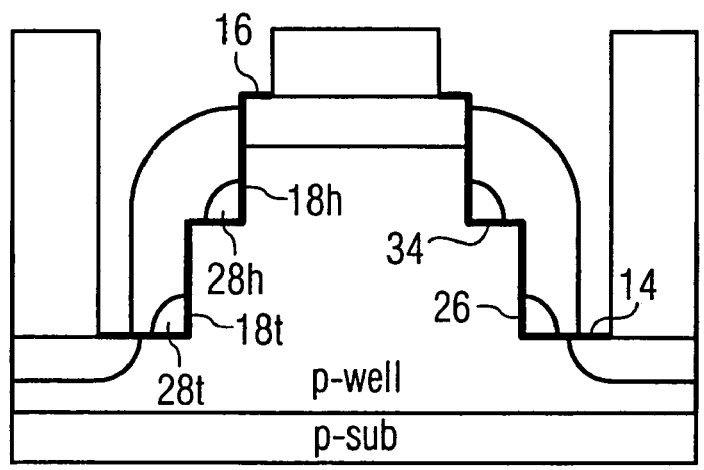
FIG. 1(b) shows a schematic sectional view of a memory cell of a second embodiment with a double step.

FIG. 1(b) shows a second embodiment of a memory cell of a semiconductor memory according to the invention. Features that have already been described in connection with FIG. 1(a) bear the same reference symbols and will not be described again. The embodiment shown in FIG. 1(b) differs from that described above by virtue of a "double step" or double mesa edge between the higher surface region 16 and the deeper surface region 14. Thus, the deeper surface region 14 adjoins a deeper step side area 18t connected to a higher step side area 18h by means of an intermediate area 34. The step side areas 18t, 18h are arranged generally perpendicular to the substrate plane, while the intermediate area 34 runs generally parallel to the substrate plane. Trapping layers 28t, 28h are respectively arranged in the corner or edge regions which are formed by the deeper surface region 14 and the deeper step side area 18t and also the intermediate area 34 and the higher step side area 18h. The trapping layers 28t, 28h are spaced apart from the channel region arranged in the semiconductor layer p-well by a gate oxide layer 26.

Each channel region is assigned two trapping layers 28t, 28h in the case of the embodiment illustrated in FIG. 1(b), so that each memory transistor can store two "bits". In this case, programming and reading are effected analogously to NROMs and described extensively in the publications by Eitan et al. mentioned in the introduction. The gate electrode 32 extends over the deeper 28t and the higher 28h trapping layer, and it directly adjoins the gate oxide 26 in regions between the trapping layers 28t, 28h. Both the gate electrode 32 and the trapping layers 28t, 28h may be patterned by means of a spacer etching.

Figure 1C:
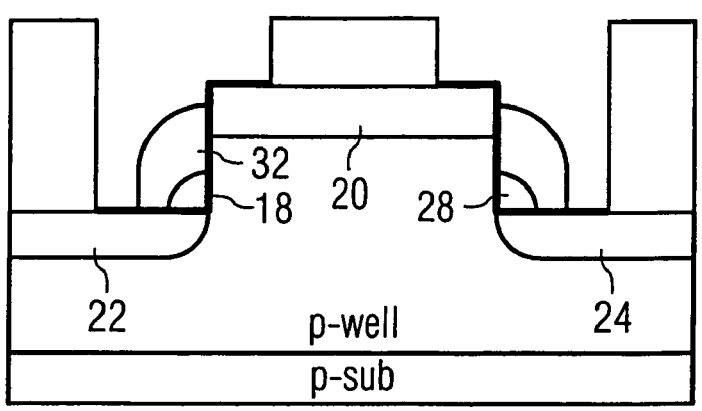
FIG. 1(c) shows a schematic sectional view of a memory cell in accordance with a third embodiment with the deeper contact region having been advanced.

FIG. 1(c) shows, in diagrammatic cross section, a third embodiment of a memory cell of a semiconductor memory according to the invention. The memory cell is similar to the embodiment described with reference to FIG. 1(a). The present embodiment is different is the formation of the deeper contact regions 22, 24, which extend as far as the step side area 18 in the case of the embodiment illustrated in FIG. 1(c). Simulations have shown that the field line profile established with such an arrangement of the deeper contact region 22 leads to a particularly efficient injection of charge carriers into the trapping layer 28.

Figure 2A:
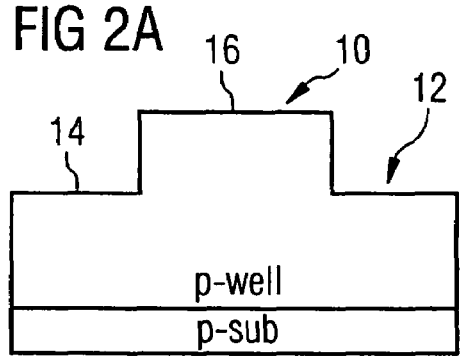
FIGS. 2(a)–(h) show intermediate stages of a memory cell of a semiconductor memory according to the invention during the fabrication process.
Figure 2B:
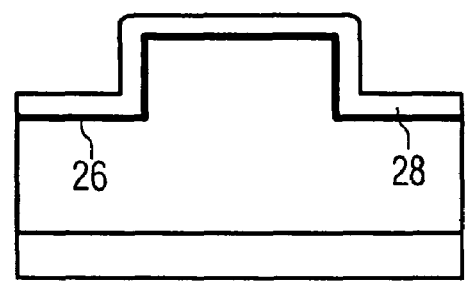
Figure 2C:
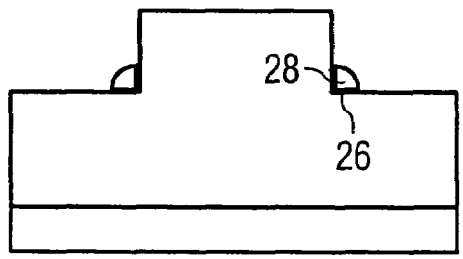
Figure 2D:
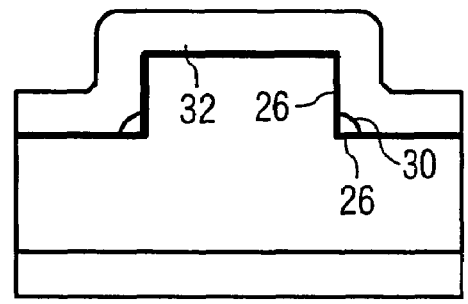

An exemplary fabrication method for a semiconductor memory according to the invention is described below with reference to FIG. 2. Apart from the doping profile, the finished method product is similar to the first embodiment variant described in connection with FIG. 1(a). A mesa is etched into the prepared substrate p-sub with the semiconductor layer (well) p-well by means of a lithography and subsequent etching step. This produces a deeper semiconductor region 10 and a higher semiconductor region 12 located at a higher level in the direction of the normal to the substrate. The distance in the direction of the normal to the substrate from the substrate p-sub to the higher surface region 16 is thus greater than the corresponding distance to the deeper surface region 14 (FIG. 2(a)). Afterward, the gate oxide layer 26 is created by oxidizing the semiconductor layer and a suitable trapping layer 28, for example a silicon nitride layer, is deposited (ON layer creation; FIG. 2(b)). FIG. 2(c) shows the intermediate stage of the memory cell after etching back the layer stack that included the trapping layer 28 and the gate oxide layer 26. The etching back is generally embodied as a so-called spacer etching, so that a "spacer residue" remains at the mesa edge and later produces the trapping layers 28 of the memory transistors (local trapping regions). A second oxide layer is subsequently applied, which covers the uncovered surface of the trapping layers 28 and also of the deeper and higher semiconductor regions 10, 12. The second oxide layer forms the control oxide layer 30 and the gate oxide layer 26 in a region, which later adjoin the gate electrode 32 (FIG. 2(d)).

Figure 2E:
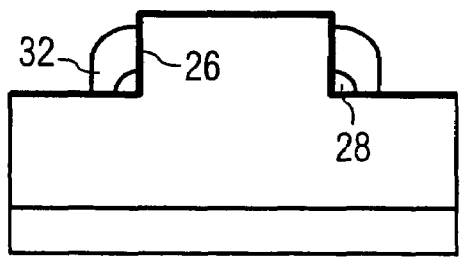
Figure 2F:
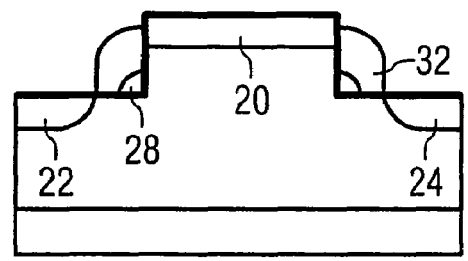
Figure 2G:
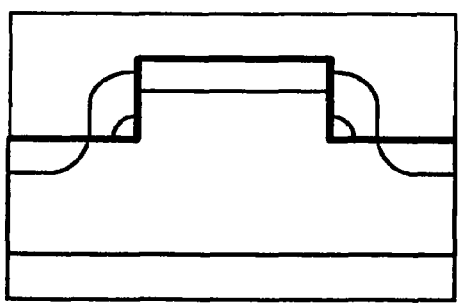
Figure 2H:
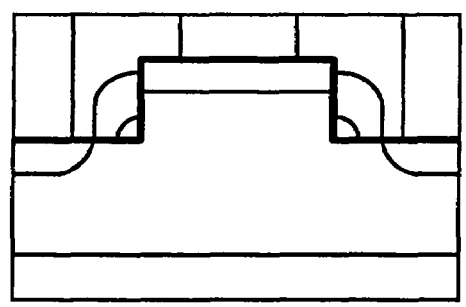

Afterward, a lithography step for defining the gate electrode 32 and also a self-aligning spacer etching of the polysilicon layer 32 are carried out in order to create the gate electrodes 32 formed in spacer-like fashion (FIG. 2(e)). The contact regions 22, 24 are subsequently formed by means of ion implantation. An LDD implantation with corresponding lithography or alternatively an inclined angle implantation at 45° may optionally be carried out (not illustrated). The deeper contact regions 22, 24 and also the higher contact region 20 are fabricated by HDD implantation and siliciding of the contact regions. The device is illustrated in this stage in FIG. 2(f). Conventional back end CMOS processes are subsequently effected, namely a passivation step by means of TEOS or BPSG or alternatively ILD (FIG. 2(g)), and also a contact hole etching and metallization for electrically contact-connecting the contact regions (FIG. 2(h)).

While the foregoing is directed to embodiments of the present invention, other and further embodiments of the invention may be devised without departing from the basic scope thereof, and the scope thereof is determined by the claims that follow.

What is claimed is:

1. A semiconductor memory having a multiplicity of memory cells, each of the memory cells comprising:
   a semiconductor layer arranged on a substrate, a semiconductor surface of said semiconductor layer having at least one step between a deeper semiconductor region and a higher semiconductor region that is higher in a direction normal to the substrate;
   at least one conductively doped deeper contact region formed in the deeper semiconductor region, and a conductively doped higher contact region formed in the higher semiconductor region;
   at least one channel region extending in the semiconductor layer between the deeper contact region and the higher contact region;
   at least one electrically insulating trapping layer designed for trapping and emitting charge carriers, the trapping layer being arranged on a gate oxide layer adjoining the channel region; and
   at least one gate electrode for controlling the electrical conductivity of the channel region, the gate electrode adjoining, in a first region, a control oxide layer arranged on the trapping layer and, in a second region, the gate oxide layer arranged on the channel region.

2. The semiconductor memory of claim 1, wherein the surface regions of the deeper semiconductor region and of the higher semiconductor region run essentially parallel to a plane of the substrate.

3. The semiconductor memory of claim 2, wherein the surface region of the higher semiconductor region forms a surface of the higher contact region.

4. The semiconductor memory of claim 1, wherein each of the memory cells comprise a multiplicity of the deeper contact regions and one of the higher contact regions and one of the channel regions extending between each of the deeper contact regions and the higher contact region.

5. The semiconductor memory of claim 4, wherein the higher semiconductor region comprises, in a section running parallel to a plane of the substrate, an essentially rectangular configuration with four side edges and each of the side edges being assigned precisely one of the deeper contact regions.

6. The semiconductor memory of claim 1, wherein the surface regions of the deeper semiconductor region and of the higher semiconductor region are connected by a step side area of the step, which runs essentially perpendicular to a substrate plane.

7. The semiconductor memory of claim 6, wherein the trapping layer is spaced apart from the step side area and the surface region of the deeper semiconductor region by the gate oxide layer.

8. The semiconductor memory of claim 1, wherein the deeper contact region extends as far as a step side area of the step.

9. The semiconductor memory of claim 1, wherein the trapping layer comprises silicon nitride.

10. A semiconductor memory having a multiplicity of memory cells, each of the memory cells comprising:
- a semiconductor layer arranged on a substrate, a semiconductor surface of said semiconductor layer having at least one step between a deeper semiconductor region and a higher semiconductor region that is higher in a direction normal to the substrate;
- at least one conductively doped deeper contact region formed in the deeper semiconductor region, and a conductively doped higher contact region formed in the higher semiconductor region, wherein each of the memory cells comprise one or more of the deeper contact regions and one of the higher contact regions and one of the channel regions extending between each of the deeper contact regions and the higher contact region;
- at least one channel region extending in the semiconductor layer between the deeper contact region and the higher contact region;
- at least one electrically insulating trapping layer designed for trapping and emitting charge carriers, the trapping layer being arranged on a gate oxide layer adjoining the channel region; and
- at least one gate electrode for controlling the electrical conductivity of the channel region, the gate electrode adjoining, in a first region, a control oxide layer arranged on the trapping layer and, in a second region, the gate oxide layer arranged on the channel region.

11. The semiconductor memory of claim 10, wherein the surface regions of the deeper semiconductor region and of the higher semiconductor region run essentially parallel to a plane of the substrate.

12. The semiconductor memory of claim 11, wherein the surface region of the higher semiconductor region forms a surface of the higher contact region.

13. The semiconductor memory of claim 10, wherein the higher semiconductor region comprises, in a section running parallel to a plane of the substrate, an essentially rectangular configuration with four side edges and each of the side edges being assigned precisely one of the deeper contact regions.

14. The semiconductor memory of claim 10, wherein the surface regions of the deeper semiconductor region and of the higher semiconductor region are connected by a step side area of the step, which runs essentially perpendicular to a substrate plane.

15. The semiconductor memory of claim 14, wherein the trapping layer is spaced apart from the step side area and the surface region of the deeper semiconductor region by the gate oxide layer.

16. The semiconductor memory of claim 10, wherein the deeper contact region extends as far as a step side area of the step.

17. The semiconductor memory of claim 10, wherein the trapping layer comprises silicon nitride.

* * * * *